(12) United States Patent
Wang

(10) Patent No.: US 9,123,283 B2
(45) Date of Patent: Sep. 1, 2015

(54) SHIFT REGISTER, GATE DRIVING CIRCUIT AND DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventor: Zheng Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 26 days.

(21) Appl. No.: 14/068,822

(22) Filed: Oct. 31, 2013

(65) Prior Publication Data
US 2014/0118237 A1    May 1, 2014

(30) Foreign Application Priority Data
Oct. 31, 2012    (CN) .......................... 2012 1 0428052

(51) Int. Cl.
*G09G 3/36*    (2006.01)
*G09G 3/20*    (2006.01)
*G11C 19/28*    (2006.01)

(52) U.S. Cl.
CPC *G09G 3/20* (2013.01); *G11C 19/28* (2013.01); *G09G 2310/0267* (2013.01); *G09G 2310/0283* (2013.01); *G09G 2310/0286* (2013.01)

(58) Field of Classification Search
CPC .............. G09G 2310/0283; G09G 2310/0267; G09G 2310/0278; G09G 2310/0281; G09G 2310/0286; G09G 2310/02–2310/0227
USPC .................................................... 345/87, 100
See application file for complete search history.

(56) References Cited

U.S. PATENT DOCUMENTS

| 2011/0316831 | A1* | 12/2011 | Ochiai et al. ................... 345/208 |
| 2012/0162187 | A1* | 6/2012 | Lee et al. ....................... 345/212 |
| 2012/0170707 | A1* | 7/2012 | Hsu et al. ......................... 377/79 |
| 2012/0269315 | A1* | 10/2012 | Jang et al. ........................ 377/75 |
| 2012/0293467 | A1* | 11/2012 | Lee et al. ....................... 345/204 |

* cited by examiner

*Primary Examiner* — Sanghyuk Park
(74) *Attorney, Agent, or Firm* — Ladas & Parry LLP

(57) ABSTRACT

The present disclosure relates to a shift register, a gate driving circuit and a display apparatus, wherein the shift register outputs an output signal of each stage in a forward direction according to a forward scanning signal and outputs the output signal of each stage in a reverse direction according to a reverse scanning signal, each stage of the shift register includes a forward scanning switch module, a reverse scanning switch module, a pull-up driving module; a pull-up module; a pull-down driving module; a first pull-down module; and a second pull-down module. A bi-directional scanning can be achieved by using the forward scanning switch module and the reverse scanning switch module to control to input different signals to different modules.

19 Claims, 7 Drawing Sheets

US 9,123,283 B2

SHIFT REGISTER, GATE DRIVING CIRCUIT AND DISPLAY APPARATUS

TECHNICAL FIELD OF THE DISCLOSURE

The present disclosure relates to a technical filed of panel display, and particularly to a shift register, a gate driving circuit and a display apparatus.

BACKGROUND

Panel displays are developed rapidly since it is ultrathin in thickness and has energy-saving characteristics. Most of panel displays adopt shift registers. At present, not only the shift registers implemented by a Gate on Array (GOA) method can be integrated on a gate driving integrated circuit (IC), but also a process step for manufacturing a panel display can be reduced, so that cost of the panel display can be saved. Therefore, in recent years, the GOA technology is widely used in the process for manufacturing the panel display.

As shown in FIG. 1, it is a present GOA design scheme, a shift register on a gate driving circuit includes a plurality of shift register units S/R(1), S/R(2), S/R(3), . . . , S/R(N) being layered and in a cascade connection. Each of the shift register units S/R(n) (1≤n≤N) outputs a scanning signal via its own signal output terminal Output to a corresponding gate line G(n), a reset signal input terminal RST of S/R(n−1) and a signal input terminal InPut of S/R(n+1), and the scanning signal functions as resetting S/R(n−1) and starting S/R(n+1) respectively, wherein S/R(1) receives a frame start signal STV via its own signal input terminal.

Each of the shift register units receives a first supply voltage VSS and a second supply voltage VDD via a first supply voltage input terminal and a second supply voltage input terminal, respectively. Each of odd numbered shift register units receives a clock signal CLK via a clock signal input terminal CLK/CLKB, and each of even numbered shift register units receives a clock signal CLKB via a clock signal input terminal CLK/CLKB, said CLK and CLKB have phases opposite to each other.

A schematic internal structural diagram for said S/R(n) is as shown in FIG. 2.

An signal output terminal of S/R(n) outputs a scanning signal under the control of the scanning signal outputted from S/R(n−1) and the clock signal inputted from its own clock signal input terminal, that is, only a forward scanning for gate lines can be implemented from G(1) to G(N). However, in an actual application, a forward scanning may be required at some times, and a reverse scanning may be required at other times (that is, scanning from G(N) to G (1)), so the shift register in the prior art can not satisfy the actual requirements, that is; the shift register in the prior art has a problem of incapable of achieving a bi-directional scanning (that is, forward and reverse scanning).

SUMMARY

Embodiments of the present disclosure provides a shift register, a gate driving circuit and a display apparatus for solving the problem that the shift register in the prior art is incapable of achieving a bi-directional scanning.

An embodiment of the present disclosure provides a shift register including a plurality of shift register units at N stages in a cascade connection, wherein a frame start signal STV is input to a first signal input terminal of a shift register unit at a first stage and a second signal input terminal of a shift register unit at an Nth stage, and a forward scanning signal and a reverse scanning signal are input to a forward scanning signal input terminal and a reverse scanning signal input terminal of each of the shift register units respectively, the shift register outputs an output signal of each stage via a signal output terminal of each stage in a forward direction according to the forward scanning signal and outputs the output signal of each stage via the signal output terminal of each stage in a reverse direction according to the reverse scanning signal, wherein the plurality of shift register units include odd numbered shift register units which receive a first clock signal and even numbered shift register units which receive a second clock signal having phase opposite to that of the first clock signal, wherein each of the shift register units S/R(n) includes:

a forward scanning switch module for turning on a pull-up driving module under the control of the forward scanning signal to output a first signal to a pull-up node PU, and outputting a second signal to a second pull-down module under the control of the forward scanning signal; the first signal is the output signal of S/R(n−1) at a previous stage of S/R(n) or STV, and the second signal is the output signal of S/R(n+1) at a next stage of S/R(n) or STV;

a reverse scanning switch module for turning on the pull-up driving module under the control of the reverse scanning signal to output the second signal to the pull-up node PU, and outputting the first signal to the second pull-down module under the control of the reverse scanning signal;

the pull-up driving module for inputting a pull-up control signal to the pull-up node PU according to an output signal of the forward scanning switch module or the reverse scanning switch module;

a pull-up module for supplying the first clock signal or the second clock signal to the signal output terminal according to the pull-up control signal of the pull-up node PU;

a pull-down driving module for outputting a pull-down control signal to a first pull-down module according to a second supply voltage VDD and the pull-up control signal of the pull-up node PU;

the first pull-down module for receiving the pull-down control signal of the pull-down driving module and supplying a first supply voltage VSS to the signal output terminal;

a second pull-down module for receiving a reset signal according to the control of the forward scanning switch module or the reverse scanning switch module, and discharging under the control of the reset signal, wherein the reset signal is the first signal or the second signal.

Another embodiment of the present disclosure provides a gate driving circuit including said shift register.

Another embodiment of the present disclosure provides a display apparatus including said gate driving circuit.

In the embodiments of the present disclosure, since the forward scanning switch module and the reverse scanning switch module are used to control the scanning direction, when a forward scanning is required, the forward scanning switch module turns on the pull-up driving module under the control of the forward scanning signal to output the first signal to the pull-up node PU and outputs the second signal to the second pull-down module under the control of the forward scanning signal, so that the forward scanning is achieved; when a reverse scanning is required, the reverse scanning switch module turns on the pull-up driving module under the control of the reverse scanning signal to output the second signal to the pull-up node PU and outputs the first signal to the second pull-down module under the control of the reverse scanning signal, so that the reverse scanning is achieved. Therefore, the shift register in embodiments of the present disclosure can achieve a bi-directional scanning, so as to remove the problem that the shift register in the prior art is incapable of achieving the reverse scanning.

BRIEF DESCRIPTION OF THE DRAWINGS

In order to more clearly describe the technical solutions of the embodiments of the present disclosure or the prior art, drawings necessary for describing the embodiments of the present disclosure or the prior art are simply introduced as follows. It should be obvious for those skilled in the art that the drawings described as follows are only some embodiments of the present disclosure and other drawings can be obtained according to these drawings without paying inventive efforts.

DETAILED DESCRIPTION

A shift register, a gate driving circuit and a display apparatus provided in embodiments of the present disclosure will be described clearly and thoroughly below in connection with drawings of the embodiments of the present disclosure. It should be obvious for those skilled in the art that the embodiments described below are only a part of embodiments of the present disclosure rather than all of the embodiments of the present disclosures. On the basis of the embodiments of the present application, all other embodiments obtained by those skilled in the art without paying inventive efforts should be considered as belonging to the scope claimed by the present disclosure.

First Embodiment

Figure 3:
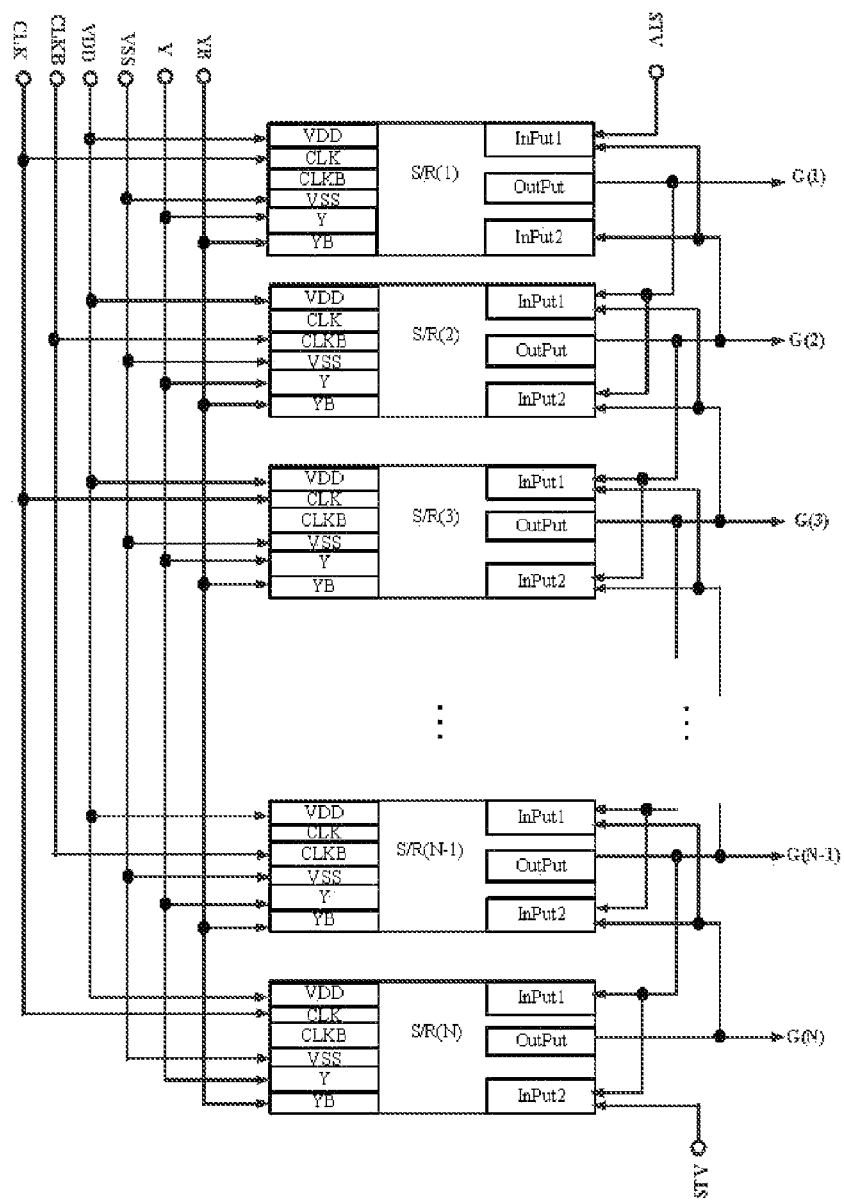
FIG. 3 is a schematic structural diagram of a shift register of a first embodiment of the present disclosure.

As shown in FIG. 3, it is a schematic structural diagram of a shift register of a first embodiment of the present disclosure, wherein except for a shift register unit at a first stage and a shift register unit at a Nth stage, a signal output terminal OutPut of each of shift register units S/R(n) is connected to a first signal input terminal InPut1 and a second signal input terminal InPut2 of an adjacent shift register unit at a next stage S/R(n+1), a first signal input terminal InPut1 and a second signal input terminal InPut2 of an adjacent shift register unit at a previous stage S/R(n−1), wherein n is a positive integer larger than 1 and smaller than N;

a frame start signal STV is connected to a first signal input terminal of the shift register unit at the first stage and a second signal input terminal of the shift register unit at the Nth stage;

a forward scanning signal and a reverse scanning signal are input to a forward scanning signal YB input terminal and a reverse scanning signal Y input terminal of each of the shift register units respectively, and the shift register outputs an output signal of each stage via a signal output terminal of each stage in a forward direction according to the forward scanning signal and outputs the output signal of each stage via the signal output terminal of each stage in a reverse direction according to the reverse scanning signal;

wherein each of the odd numbered shift register units receives a first clock signal CLK via its own first clock signal input terminal, and each of the even numbered shift register units receives a second clock signal CLKB via its own second clock signal input terminal, wherein the second clock signal CLKB has phase opposite to that of the first clock signal CLK;

wherein each of the shift register units further has a first supply voltage VSS input terminal and a second supply voltage VDD input terminal for inputting a first supply voltage and a second supply voltage respectively, the first supply voltage and the second supply voltage are sued to ensure that the shift register unit operates normally.

Figure 4:
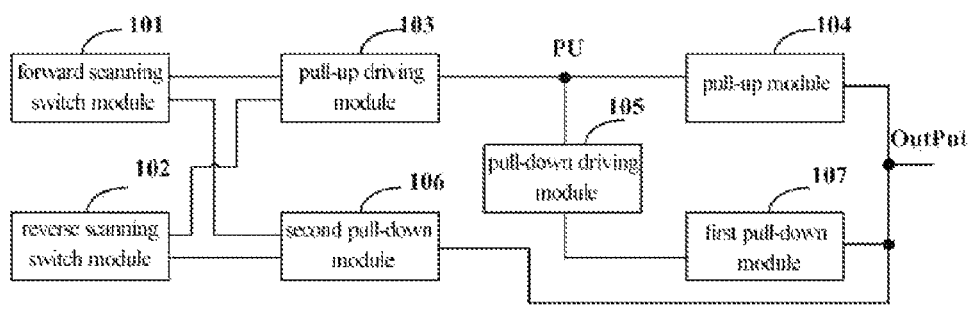
FIG. 4 is a schematic structural diagram of a shift register unit of the first embodiment of the present disclosure.
Figure 5:
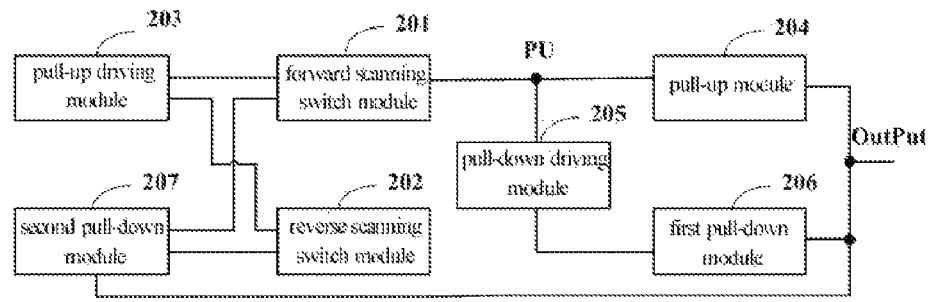
FIG. 5 is a schematic structural diagram of a shift register unit of the first embodiment of the present disclosure.

The schematic structural diagram of each of the shift register units is as shown in FIG. 4 or FIG. 5, each of the shift register units includes:

a forward scanning switch module for turning on a pull-up driving module under the control of the forward scanning signal to output a first signal to a pull-up node PU, and outputting a second signal to a second pull-down module under the control of the forward scanning signal; the first signal is the output signal of the shift register unit S/R(n−1) at a previous stage of the shift register unit S/R(n) or STV, and the second signal is the output signal of the shift register unit S/R(n+1) at a next stage of the shift register unit S/R(n) or STV;

a reverse scanning switch module for turning on the pull-up driving module under the control of the reverse scanning signal to output the second signal to the pull-up node PU, and outputting the first signal to the second pull-down module under the control of the reverse scanning signal;

the pull-up driving module for inputting a pull-up control signal to the pull-up node PU according to an output signal of the forward scanning switch module or the reverse scanning switch module;

a pull-up module for supplying the first clock signal or the second clock signal to the signal output terminal according to the pull-up control signal of the pull-up node PU;

a pull-down driving module for outputting a pull-down control signal to a first pull-down module according to the second supply voltage VDD and the pull-up control signal at the pull-up node PU;

the first pull-down module for receiving the pull-down control signal of the pull-down driving module and supplying the first supply voltage VSS to the signal output terminal;

a second pull-down module for receiving a reset signal according to the control of the forward scanning switch module or the reverse scanning switch module, and discharging under the control of the reset signal, wherein the reset signal is the first signal or the second signal.

In the scheme of the first embodiment of the present disclosure, since the forward scanning switch module and the reverse scanning switch module are added into each of the shift register units, when a forward scanning is required, the forward scanning signal is input to the forward scanning switch module of each of the shift register units to control the signals input to the pull-up driving module and the second pull-down module, so that the forward scanning is achieved; when a reverse scanning is required, the reverse scanning signal is input to the reverse scanning switch module of each of the shift register units to control the signals input to the pull-up driving module and the second pull-down module, so that the reverse scanning is achieved. Therefore, the problem of the shift register in the prior art incapable of achieving a bi-directional scanning can be removed.

In order to illustrate the solution of the first embodiment of the present disclosure, hereinafter the shift register provided in the first embodiment of the present disclosure is described in detail by means of the specific circuit of the shift register unit provided in a second embodiment of the present disclosure. Naturally, the present disclosure is not limited to the circuit in the second embodiment of the present disclosure, and any circuit capable of realizing the operating principle of the shift register recited in the first embodiment of the disclosure falls into the protection scope of the present invention.

Second Embodiment

The second embodiment of the present disclosure gives detailed description to particular circuit structure of the shift register unit in the first embodiment of the present disclosure shown in FIG. 4 and FIG. 5.

Figure 6:
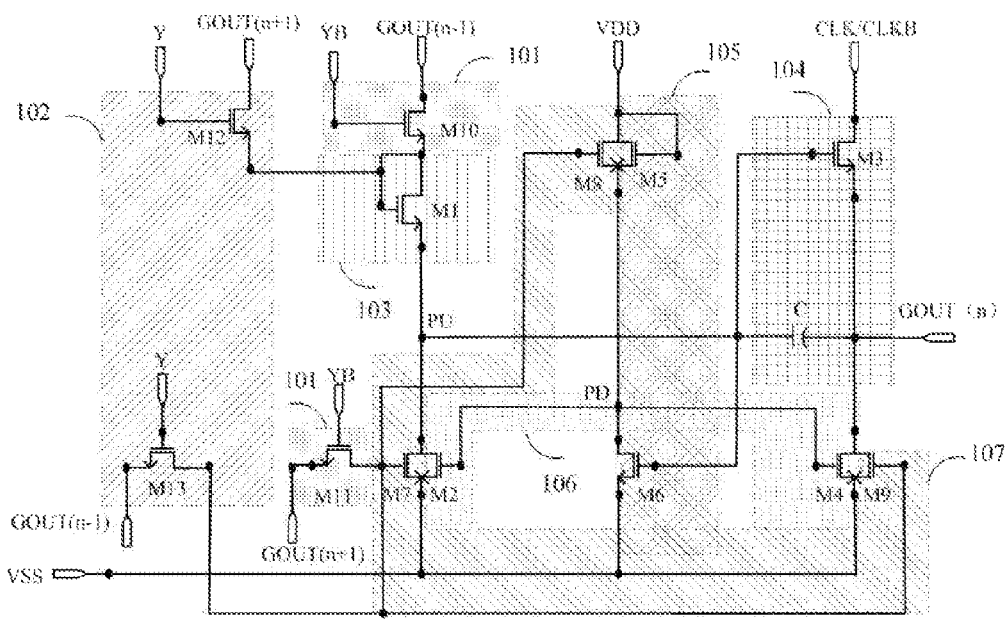
FIG. 6 is a circuitry diagram of a shift register unit of a second embodiment of the present disclosure.

As for the structure of the shift register unit shown in FIG. 4, its particular circuit can be as shown in FIG. 6.

The forward scanning switch module 101 includes a tenth transistor M10 having a source connected to the first signal input terminal, a gate connected to the forward scanning signal input terminal, and a drain connected to an input node of the pull-up driving module; an eleventh transistor M11 having a source connected to the second signal input terminal, a gate connected to the forward scanning signal input terminal, and a drain connected to an input node of the second pull-down module.

The reverse scanning switch module 102 includes a twelfth transistor having a source connected to the second signal input terminal, a gate connected to the reverse scanning signal input terminal, and a drain connected to the input node of the pull-up driving module; a thirteenth transistor having a source connected to the first signal input terminal, a gate connected to the reverse scanning signal input terminal, and a drain connected to the input node of the second pull-down module.

The pull-up driving module 103 includes a first transistor having a source and a gate together connected to the input node of the pull-up driving module and a drain connected to the pull-up node PU.

The pull-up module 104 includes a third transistor having a gate connected to the pull-up node PU, a source receiving the corresponding first or second clock signal, and a drain connected to the signal output terminal; and a capacitor connected between the pull-up node PU and the signal output terminal.

The pull-down driving module 105 includes a fifth transistor having a source and gate together connected to the second supply voltage VDD and a drain connected to a pull-down node PD; a sixth transistor having a gate connected to the pull-up node PU, a source connected to the pull-down node PD, and a drain connected to the first supply voltage VSS.

The first pull-down module 106 includes a second transistor having a source connected to the pull-up node PU, a gate connected to the pull-down node PD and a drain connected to the first supply voltage VSS; a fourth transistor having a gate connected to the pull-down node PD, a source connected to the signal output terminal, and a drain connected to the first supply voltage VSS.

The second pull-down module 107 includes a seventh transistor having a gate connected to an input node of the second pull-down module, a source connected to the pull-up node PU, and a drain connected to the first supply voltage VSS; an eighth transistor having a source connected to the second supply voltage VDD, a gate connected to the input node of the second pull-down module, and a drain connected to the pull-down node PD; and a ninth transistor having a gate connected to the input node of the second pull-down module, a source connected to the signal output terminal, and a drain connected to the first supply voltage VSS.

Please note that the source and the drain of each of the transistors used herein can be interchanged since they are symmetric. In embodiments of the present disclosure, in order to distinguish two electrodes other than a gate of a transistor, one of the two electrodes is referred to as a source and the other is referred to as a drain. If the source is selected as the signal input terminal, the drain will be used as the signal output terminal, and vice versa.

Figure 7:
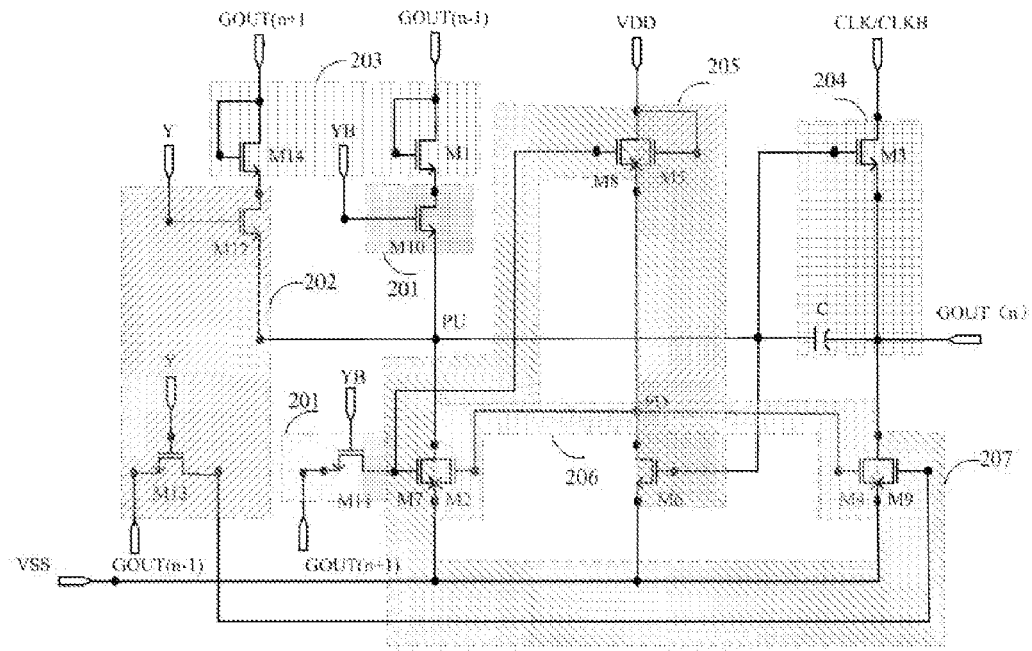
FIG. 7 is a circuitry diagram of a shift register unit of the second embodiment of the present disclosure.

As for the structure of the shift register unit shown in FIG. 5, its particular circuit can be as shown in FIG. 7.

The forward scanning switch module 201 includes a tenth transistor having a drain connected to the pull-up node PU, a gate connected to the forward scanning signal input terminal, and a source connected to a first output node of the pull-up driving module; an eleventh transistor having a source connected to the second signal input terminal, a gate connected to the forward scanning signal input terminal, and a drain connected to an input node of the second pull-down module.

The reverse scanning switch module 202 includes a twelfth transistor M12 having a drain connected to the pull-up node PU, a gate connected to the reverse scanning signal input terminal, and a source connected to a second output node of the pull-up driving module; a thirteenth transistor having a source connected to the first signal input terminal, a gate connected to the reverse scanning signal input terminal, and a drain connected to the input node of the second pull-down module.

The pull-up driving module 203 includes a first transistor having a source and a gate together connected to the first signal input terminal and a drain connected to the source of the tenth transistor; and a fourteenth transistor having a source and a gate together connected to the second signal input terminal and a drain connected to the source of the twelfth transistor.

The pull-up module 204 includes a third transistor having a gate connected to the pull-up node PU, a source receiving the corresponding first or second clock signal, and a drain connected to the signal output terminal; and a capacitor connected between the pull-up node PU and the signal output terminal.

The pull-down driving module 205 includes a fifth transistor having a source and gate together connected to the second supply voltage VDD and a drain connected to a pull-down node PD; a sixth transistor having a gate connected to the pull-up node PU, a source connected to the pull-down node PD, and a drain connected to the first supply voltage VSS.

The first pull-down module 206 includes a second transistor having a source connected to the pull-up node PU, a gate connected to the pull-down node PD and a drain connected to the first supply voltage VSS; a fourth transistor having a gate connected to the pull-down node PD, a source connected to the signal output terminal, and a drain connected to the first supply voltage VSS.

The second pull-down module 207 includes a seventh transistor having a gate connected to an input node of the second pull-down module, a source connected to the pull-up node PU, and a drain connected to the first supply voltage VSS; an eighth transistor having a source connected to the second supply voltage VDD, a gate connected to the input node of the second pull-down module, and a drain connected to the pull-down node PD; and a ninth transistor having a gate connected to the input node of the second pull-down module, a source connected to the signal output terminal, and a drain connected to the first supply voltage VSS.

Main difference between the shift register units shown in FIG. 6 and FIG. 7 lies in:

when the shift register unit shown in FIG. 6 performs the forward scanning (reverse scanning), the input first signal (second signal) firstly passes through the forward scanning switch module (reverse scanning switch module), and then passes through the pull-up driving module;

when the shift register unit shown in FIG. 7 performs the forward scanning (reverse scanning), the input first signal (second signal) firstly passes through the pull-up driving module, and then passes through the forward scanning switch module (reverse scanning switch module);

no matter whether the signal firstly or lastly passes through the forward scanning switch module (reverse scanning switch module), the forward scanning switch module (reverse scanning switch module) controls whether the input signal can be input to other modules, so as to achieve the forward scanning (reverse scanning).

The present disclosure is not limited to the circuit form shown in FIG. 6 or FIG. 7, and the concept of the present disclosure may be changed on the basis of FIG. 6 or FIG. 7.

For example, on the basis of the circuit shown in FIG. 6, another transistor (for example, a sixteenth transistor M16, not shown in Figs.) can be added between the drain of M12 and the node PU, and it has a drain connected to the node PU and a source and gate together connected to the drain of M12.

For example, on the basis of the circuit shown in FIG. 7, a fifteenth transistor M15 can be added, and it has a gate connected to the gate of M7, a drain connected to the first supply voltage VSS, and a source connected to the node PU. A circuit diagram of the shift register unit with the fifteenth transistor M15 added is shown in FIG. 8, and the shift register unit shown in FIG. 8 can also achieve a bi-directional scanning function.

Figure 8:
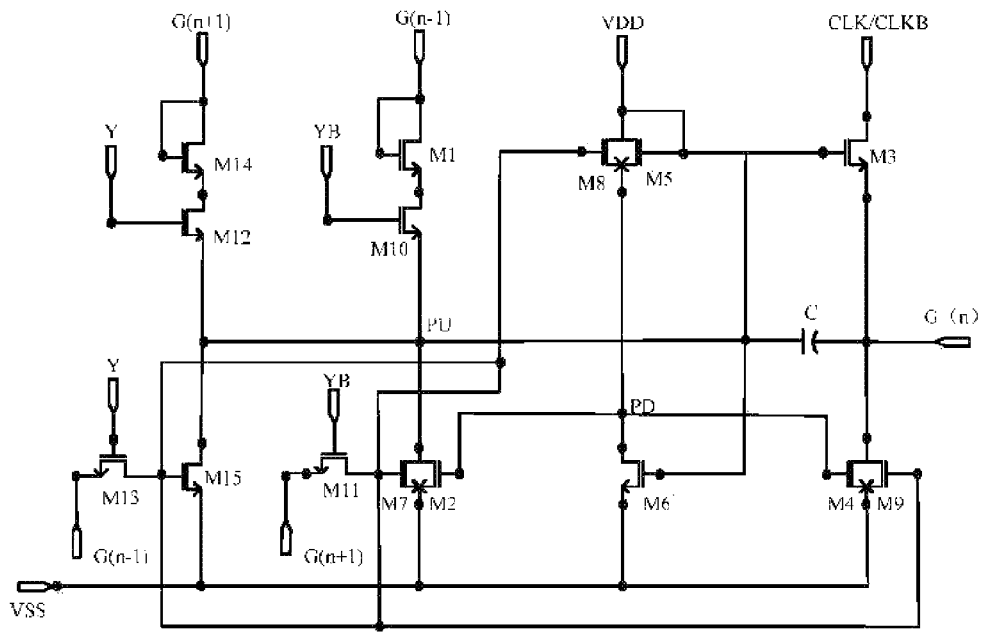
FIG. 8 is a circuitry diagram of a shift register unit of the second embodiment of the present disclosure.

From the schematic diagram shown in FIG. 8, it can be seen that M15 and M7 form a structure of common-gate, common-source and common-drain, therefore M7 can be removed on the basis of FIG. 8, and the bi-directional scanning can also be achieved.

It should be explained that whether to remove or maintain M15 or M7 shown in FIG. 8 can be determined according to size of the transistor. When both the transistor M15 and the transistor M7 are maintained, the sizes of the transistor M15 and the transistor M7 can be made larger. When only one of the transistor M15 and the transistor M7 is maintained, the size of the maintained transistor can be made smaller.

Particularly, when the above discussed shift register unit performs the bi-direction scanning, the level of the forward scanning signal and that of the reverse scanning signal can be as follows.

Figure 1:
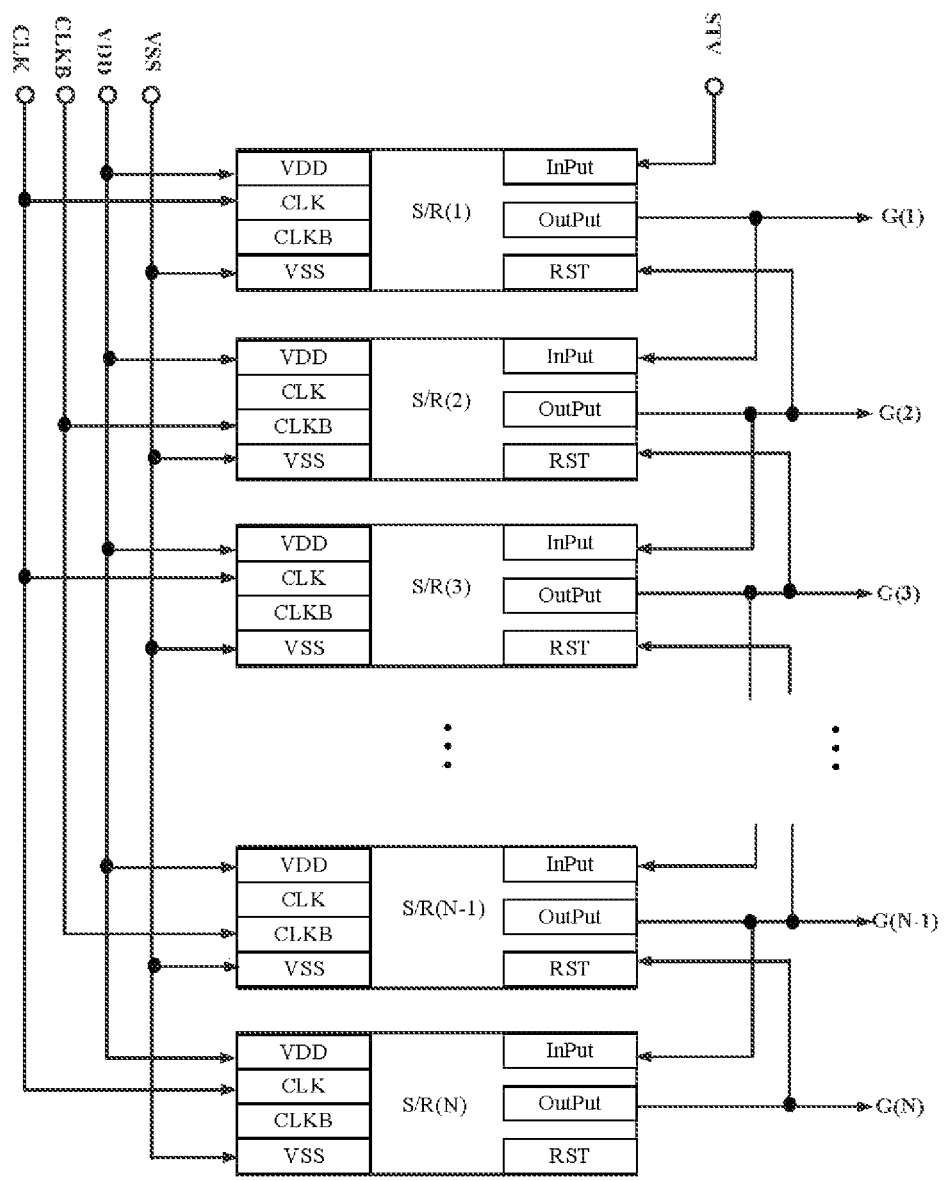
FIG. 1 is a schematic structural diagram of a shift register in the prior art.
Figure 2:
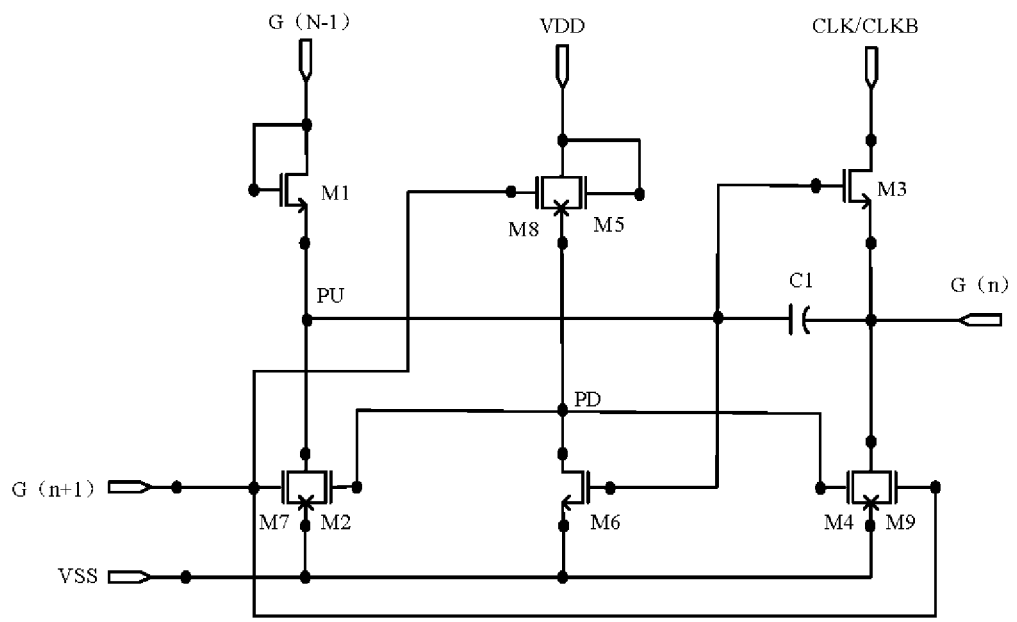
FIG. 2 is a schematic structural diagram of a shift register unit in the prior art

When the forward scanning is performed, the forward scanning signal YB is a high level signal, the reverse scanning signal Y is a low level signal; since when the forward scanning signal YB is the high level signal and the reverse scanning signal Y is the low level signal, M10 and M11 are turned on and M12 and M13 are turned off in FIG. 7; at this time, the circuit actually in operation is equivalent to the shift register circuit described in the background, the shift register unit S/R(n) uses the output signal GOUT(n−1) from the shift register unit S/R(n−1) at a previous stage as its input signal and uses the output signal GOUT(n+1) from the shift register unit S/R(n+1) at a next stage as its reset signal, that is, the circuit diagram actually in operation is equivalent to that shown in FIG. 2, so that the forward scanning can be achieved.

When the reverse scanning is performed, the forward scanning signal YB is the low level signal, the reverse scanning signal Y is the high level signal; since when the forward scanning signal YB is the low level signal and the reverse scanning signal Y is the high level signal, M10 and M11 are turned off and M12 and M13 are turned on in FIG. 8; at this time, the circuit actually in operation is equivalent to the shift register circuit described in the background, the shift register unit S/R(n) uses the output signal GOUT(n+1) from the shift register unit S/R(n+1) at the next stage as its input signal and uses the output signal GOUT(n−1) from the shift register unit S/R(n−1) at the previous stage as its reset signal, so that the reverse scanning can be achieved.

In the second embodiment of the present disclosure, since M10, M11, M12 and M13 are controlled to be turned on or off according to the forward scanning signal and the reverse scanning signal, the forward scanning signal is the high level signal and the reverse scanning signal is the low level signal when the forward scanning is required, so that the shift register can perform the forward scanning; the forward scanning signal YB is the low level signal and the reverse scanning signal Y is the high level signal when the reverse scanning is required, so that the shift register can perform the reverse scanning. That is, the shift register in the second embodiment of the disclosure achieves a bi-direction scanning.

Third Embodiment

Figure 9:
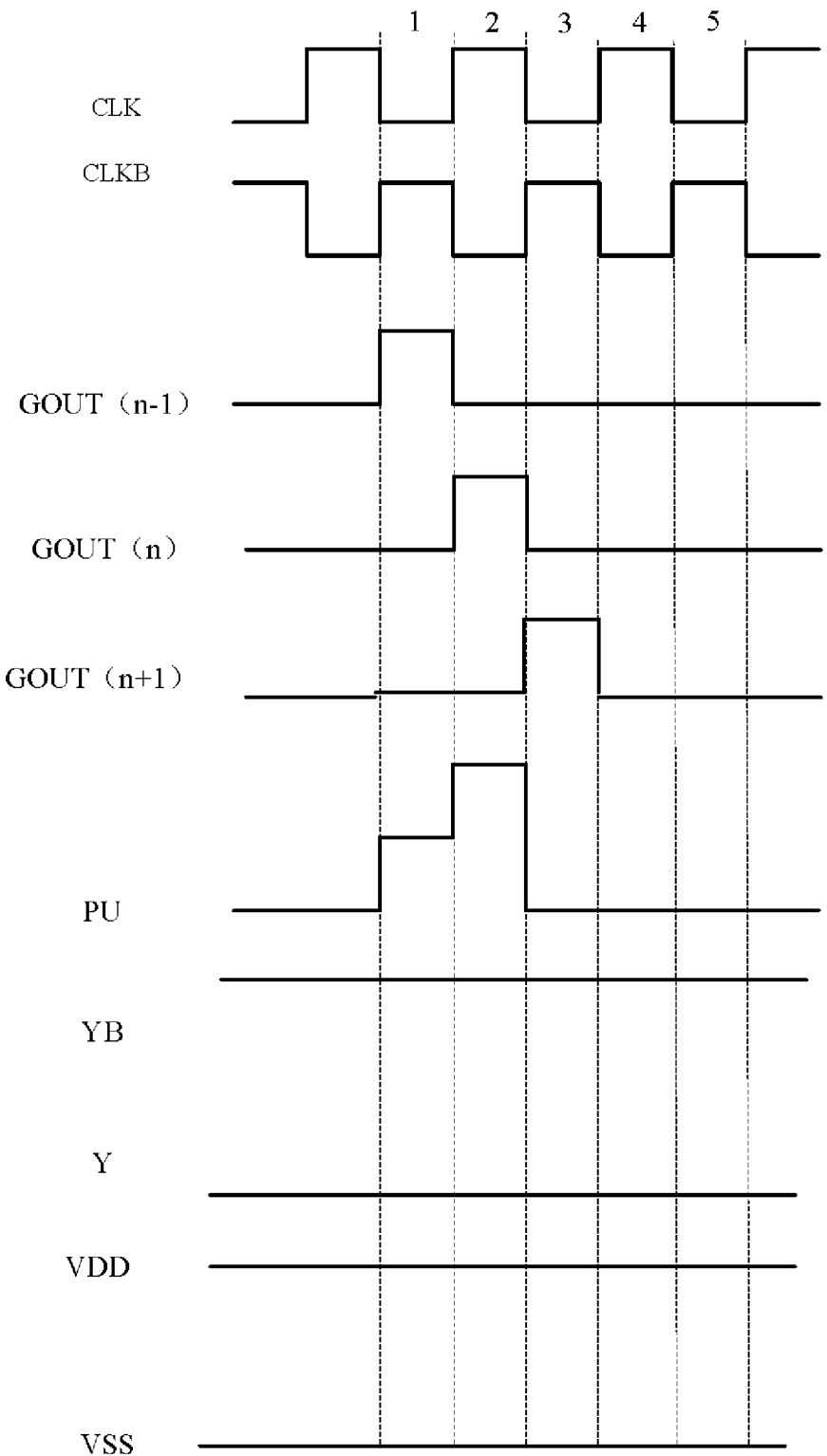
FIG. 9 is a schematic timing sequence diagram when a forward scanning is performed by the shift register unit in a third embodiment of the present disclosure.
Figure 10:
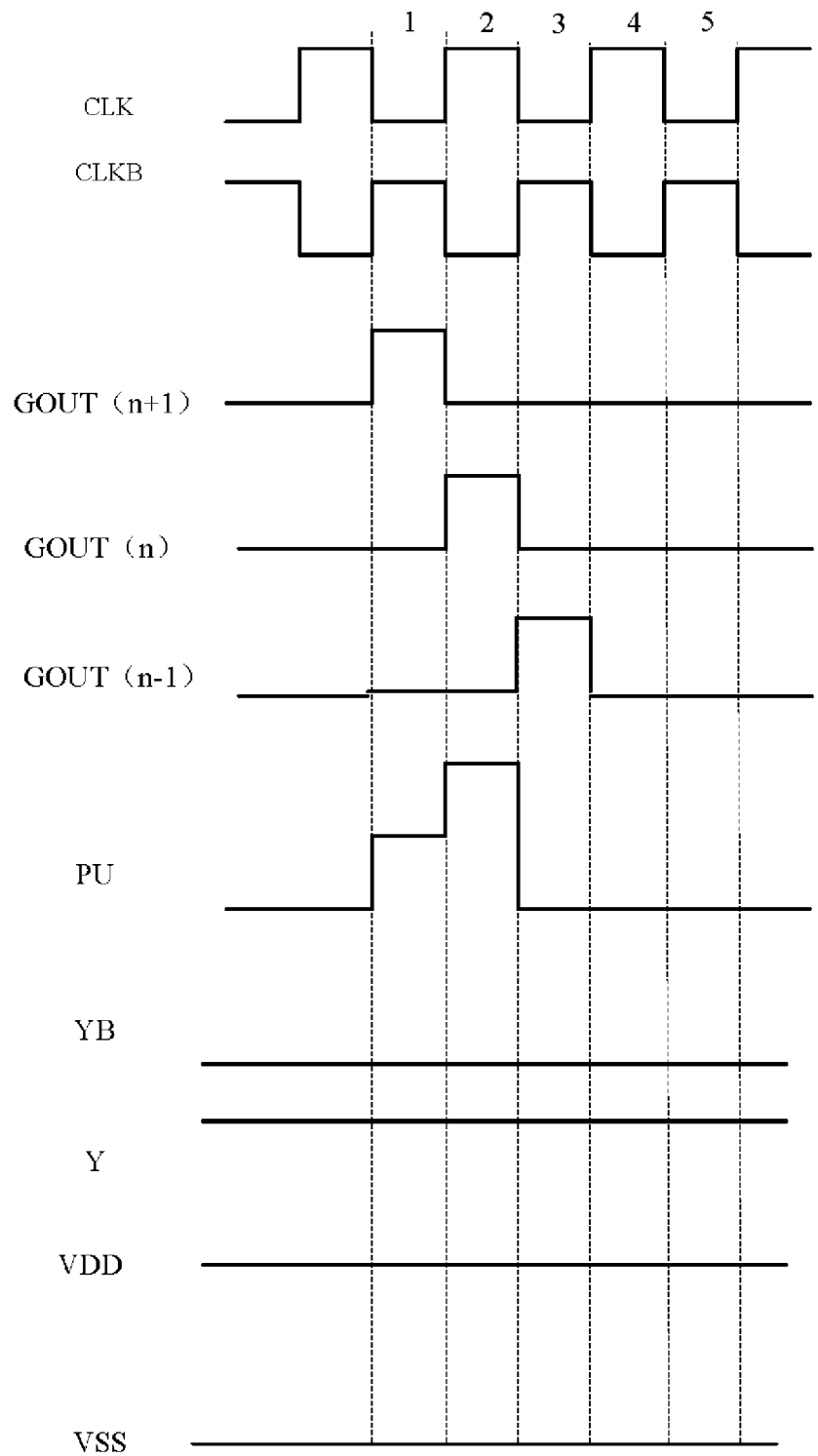
FIG. 10 is a schematic timing sequence diagram when a reverse scanning is performed by the shift register unit in the third embodiment of the present disclosure.

In order to explain the shift register unit provided in the second embodiment of the present disclosure, the third embodiment will explain the operational principle of the shift register unit by taking the circuit of the shift register unit shown in FIG. 7 as an example and combining with the timing sequence diagram for scanning shown in FIG. 9 and FIG. 10.

As shown in FIG. 9, it is a schematic timing sequence diagram of the shift register provided by the third embodiment of the present disclosure when the forward scanning is performed, wherein CLK is the clock signal input to the shift register unit S/R(n), CLKB is the clock signal input to the shift register unit S/R(n−1) and the shift register unit S/R(n+1); GOUT(n−1) is the output signal from the shift register unit S/R(n−1) at the previous stage of the shift register unit S/R(n) and is used as the input signal of the shift register unit S/R(n); YB is the forward scanning signal input to the shift register unit S/R(n) and is the high level signal, and at this time M10 and M11 are both turned on; Y is the reverse scanning signal input to the shift register unit S/R(n) and is the low level signal, and at this time M12 and M13 are both turned off; VSS is the first supply voltage input to the shift register unit S/R(n) and is the low level signal; VDD is the second supply voltage input to the shift register unit S/R(n) and is the high level signal.

The timing sequence process for the forward scanning of the shift register unit S/R(n) can be divided into the following five phases (1, 2, 3, 4 and 5 in FIG. 9 are time periods representing the five phases).

In the first phase, that is, in a first half cycle of a first clock cycle, the shift register unit S/R(n) receives the high level signal GOUT(n−1) output from S/R(n−1), M1 is turned on, the high level signal GOUT(n−1) charges the capacitor C via M1, so that the level of the node PU increases, and M3 is turned on under the driving of the increased level of the node PU; the size of M6 is designed to make the level of the node PD decrease, so that M2 and M4 are turned off; since M3 is turned on and the clock signal input to the shift register unit S/R(n) is the low level signal, the low level signal of the clock signal is output through M3 at this time, that is, GOUT(n) is the low level signal in this first phase, as shown in FIG. 9.

In the second phase, that is, in a second half cycle of the first clock cycle, the input signal input to the shift register unit S/R(n) is the low level signal (that is, GOUT(n−1) at the low level in this second phase), M1 is turned off, the node PU still remains at the high level, the pull-down node PD maintains the low level in the first phase, and therefore M2 and M4 are still turned off; the clock signal CLK is the high level signal, and the voltage at the node PU is increased due to a bootstrapping effect, that is, the voltage at the terminal of the capacitor C at which the capacitor is connected to the node PU is increased continuously on the basis of the voltage obtained in the first phase, and M3 keeps to be turned on; therefore the high level signal of the clock signal is output through M3 at this time, that is, GOUT(n) is the high level signal at this second phase, as shown in FIG. 9.

In the third phase, that is, in a first half cycle of a second clock cycle, the reset signal input to the shift register unit S/R(n) is the high level signal (that is, the signal GOUT(n+1) output from the shift register unit S/R(n+1) at the next stage of the shift register unit S/R(n) is the high level signal in this third phase), the clock signal input to the shift register unit S/R(n) is the low level signal, M7, M8 and M9 are all turned on, the capacitor C is discharged, and therefore the level at the node PU connected to M7 is pulled down to the level of VSS, thereby M6 being turned off; at this time the node PD is connected to M5, M5 is turned on under the control of the high level signal VDD, and therefore the level of the node PD becomes the high level. Since the gate of M2 and the gate of M4 are both connected to the node PD, M2 and M4 are both turned on when the level of the node PD becomes the high level. Since the gate of M3 is connected to the node PU, M3 is turned off after the level of the node PU decreases to the level of VSS. Since M2 and M4 are both turned on, VSS is the output of the shift register unit S/R(n), that is, GOUT(n) is the low level signal in this third phase, as shown in FIG. 9.

In the fourth phase, that is, in a second half cycle of the second clock cycle, the clock signal input to the shift register unit S/R(n) is the high level signal. Since the gate of M3 is still at the low level, M3 still maintains to be turned off as in the third phase, the high level signal of the clock signal input to the shift register unit S/R(n) will not be output from M3. Since M2 and M4 are both turned on, VSS still serves as the output of the shift register unit S/R(n). Therefore, the signal GOUT(n) output from the shift register unit S/R(n) keeps to be the low level signal as in the third phase, that is, GOUT(n) is the low level signal in this fourth phase, as shown in FIG. 9.

In the fifth phase, that is, a first half cycle of a third clock cycle, the clock signal input to the shift register unit S/R(n) is the low level signal. Since the gate of M3 is still at the low level, M3 still maintains to be turned off as in the third phase, and the low level signal of the clock signal input to the shift register unit S/R(n) will not be transmitted to the signal output terminal. Since M2 and M4 are still both turned on, VSS still serves as the output of the shift register unit S/R(n). Therefore, the signal GOUT(n) output from the shift register unit S/R(n) keeps to be the low level signal as in the third phase, that is GOUT(n) is the low level signal in this fifth phase, as shown in FIG. 9.

Then the fourth phase and the fifth phase are repeated in sequence, until the shift register unit S/R(n) receives a high level signal GOUT(n−1) output from the shift register unit S/R(n−1) at the previous stage of the shift register unit S/R(n) and resumes to perform the first phase.

As shown in FIG. 10, it is a schematic timing sequence diagram of the shift register provided by the third embodiment of the present disclosure when the reverse scanning is performed, wherein CLK is the clock signal input to the shift register unit S/R(n), CLKB is the clock signal input to the shift register unit S/R(n−1) and the shift register unit S/R(n+1); GOUT(n+1) is the output signal from the shift register unit S/R(n+1) and is used as the input signal of the shift register unit S/R(n); YB is the forward scanning signal input to the shift register unit S/R(n) and is the low level signal, and at this time M10 and M11 are both turned off; Y is the reverse scanning signal input to the shift register unit S/R(n) and is the high level signal, and at this time M12 and M13 are both turned on; VSS is the first supply voltage input to the shift register unit S/R(n) and is the low level signal; VDD is the second supply voltage input to the shift register unit S/R(n) and is the high level signal.

The timing sequence process for the reverse scanning of the shift register unit S/R(n) can be divided into the following five phases (1, 2, 3, 4 and 5 in FIG. 10 are time periods representing the five phases).

In the first phase, that is, in a first half cycle of a first clock cycle, the shift register unit S/R(n) receives the high level signal GOUT(n+1) output from S/R(n+1), M14 is turned on, the high level signal GOUT(n+1) charges the capacitor C via M14 and M12, so that the level of the node PU increases, and M3 is turned on under the driving of the increased level of the node PU; the size of M6 is designed to make the level of the node PD decrease, so that M2 and M4 are turned off; since M3 is turned on and the clock signal input to the shift register unit S/R(n) is the low level signal, and the low level signal of the clock signal is output through M3, that is, GOUT(n) is the low level signal in this first phase, as shown in FIG. 10.

In the second phase, that is, in a second half cycle of the first clock cycle, the input signal input to the shift register unit S/R(n) is the low level signal (that is, GOUT(n+1) is the low level signal in this second phase). M14 is turned off, the level of the node PU still keeps at the high level, the pull-down node PD maintains the low level as in the first phase, and therefore M2 and M4 are still turned off, the clock signal CLK is the high level signal, and the voltage at the node PU is increased due to a bootstrapping effect, that is, the voltage at the terminal of the capacitor C at which the capacitor C is connected to the node PU is increased continuously on the basis of the voltage obtained in the first phase, and M3 keeps to be turned on; therefore the high level signal of the clock signal is output through M3, that is, GOUT(n) is the high level signal in this second phase, as shown in FIG. 10.

In the third phase, that is, in a first half cycle of a second clock cycle, the reset signal input to the shift register unit S/R(n) is the high level signal (that is, the signal GOUT(n−1) output from the shift register unit S/R(n−1) at the previous stage of the shift register unit SIR(n) is the high level signal in this third phase), the clock signal input to the shift register unit S/R(n) is the low level signal, M7, M8 and M9 are all turned on, the capacitor C is discharged, and therefore the level at the node PU connected to M7 is pulled down to the level of VSS, thereby M6 is turned off; at this time the node PD is connected to M5, and M5 is on under the control of the high level signal VDD, and therefore the level of the node PD becomes the high level. Since the gate of M2 and the gate of M4 are both connected to the node PD, M2 and M4 are both turned on when the level of the node PD becomes the high level. Since the gate of M3 is connected to the node PU, M3 is turned off after the level of the node PU decreases to the level of VSS. Since M2 and M4 are both turned on, VSS is the output of the shift register unit S/R(n), that is. GOUT(n) is the low level signal in this third phase, as shown in FIG. 10.

In the fourth phase, that is, in a second half cycle of the second clock cycle, the clock signal input to the shift register unit S/R(n) is the high level signal. Since the gate of M3 is still at the low level. M3 still maintains to be turned off as in the third phase, the high level signal of the clock signal input to the shift register unit S/R(n) will not be output from M3. Since M2 and M4 are both turned on, VSS is still the output of the shift register unit S/R(n). Therefore, the signal GOUT(n) output from the shift register unit S/R(n) keeps to be the low level signal as in the third phase, that is, GOUT(n) is the low level signal in this fourth phase, as shown in FIG. 10.

In the fifth phase, that is, a first half cycle of a third clock cycle, the clock signal input to the shift register unit S/R(n) is the low level signal. Since the gate of M3 is still at the low level, M3 still maintains to be turned off as in the third phase, the low level signal of the clock signal input to the shift register unit S/R(n) will not be transmitted to the signal output terminal. Since M2 and M4 are both turned on, VSS is still the output of the shift register unit S/R(n). Therefore, the signal GOUT(n) output from the shift register unit S/R(n) keeps to be the low level signal as in the third phase, that is, GOUT(n) is the low level signal in this fifth phase, as shown in FIG. 10

Then the fourth phase and the fifth phase are repeated in turn, until the shift register unit S/R(n) receives the high level signal GOUT(n+1) output from the shift register unit S/R(n+1) at the next stage and resumes to perform the first phase.

Fourth Embodiment

The fourth embodiment of the present disclosure provides a gate driving circuit including the shift register provided in anyone of the first to third embodiments.

Fifth Embodiment

The fifth embodiment of the present disclosure provides a display apparatus including the gate driving circuit provided in the fourth embodiment.

The above descriptions are only for illustrating the embodiments of the present disclosure, and in no way limit the scope of the present disclosure. It will be obvious that those skilled in the art may make modifications, variations and equivalences to the above embodiments without departing from the spirit and scope of the present disclosure as defined by the following claims. Such variations and modifications are intended to be included within the spirit and scope of the present disclosure.

What is claimed is:

1. A shift register comprising shift register units at N stages in a cascade connection, wherein a frame start signal STV is input to a first signal input terminal of a shift register unit at a first stage and a second signal input terminal of a shift register unit at an Nth stage, and a forward scanning signal and a reverse scanning signal are input to a forward scanning signal input terminal and a reverse scanning signal input terminal of each of the shift register units respectively, the shift register outputs an output signal of each stage via a signal output terminal of each stage in a forward direction according to the forward scanning signal and outputs the output signal of each stage via the signal output terminal of each stage in a reverse direction according to the reverse scanning signal, wherein the shift register units at N stages comprises odd numbered shift register units which receive a first clock signal and even numbered shift register units which receive a second clock signal having phase opposite to that of the first clock signal, wherein each of the shift register units (S/R(n)) comprises:
a forward scanning switch module for turning on a pull-up driving module under the control of the forward scanning signal to output a first signal to a pull-up node (PU), and outputting a second signal to a second pull-down module under control of the forward scanning signal; the first signal is the output signal of a shift register unit (S/R(n−1)) at a previous stage of the shift register unit (S/R(n)) or STV, and the second signal is the output signal of a shift register unit (S/R(n+1)) at a next stage of the shift register unit (S/R(n)) or STV;
a reverse scanning switch module for turning on the pull-up driving module under control of the reverse scanning signal to output the second signal to the pull-up node (PU), and outputting the first signal to the second pull-down module under the control of the reverse scanning signal;
the pull-up driving module for inputting a pull-up control signal to the pull-up node (PU) according to an output signal of the forward scanning switch module or the reverse scanning switch module;
a pull-up module for supplying the first clock signal or the second clock signal to the signal output terminal according to the pull-up control signal of the pull-up node (PU);
a pull-down driving module for outputting a pull-down control signal to a first pull-down module according to a second supply voltage (VDD) and the pull-up control signal of the pull-up node (PU);
the first pull-down module for receiving the pull-down control signal of the pull-down driving module and supplying a first supply voltage (VSS) to the signal output terminal;
a second pull-down module for receiving a reset signal according to the control of the forward scanning switch module or the reverse scanning switch module, and discharging under control of the reset signal, wherein the reset signal is the first signal or the second signal.

2. The shift register of claim 1, wherein the forward scanning switch module comprises:
a tenth transistor having a source connected to the first signal input terminal, a gate connected to the forward scanning signal input terminal, and a drain connected to an input node of the pull-up driving module; and
an eleventh transistor having a source connected to the second signal input terminal, a gate connected to the forward scanning signal input terminal, and a drain connected to an input node of the second pull-down module.

3. The shift register of claim 2, wherein the reverse scanning switch module comprises:
a twelfth transistor having a source connected to the second signal input terminal, a gate connected to the reverse scanning signal input terminal, and a drain connected to the input node of the pull-up driving module; and
a thirteenth transistor having a source connected to the first signal input terminal, a gate connected to the reverse scanning signal input terminal, and a drain connected to the input node of the second pull-down module.

4. The shift register of claim 3, wherein the pull-up driving module comprises:

a first transistor having a source and a gate together connected to the input node of the pull-up driving module, and a drain connected to the pull-up node (PU).

5. The shift register of claim 4, wherein the pull-up module comprises:
a third transistor having a gate connected to the pull-up node (PU), a source receiving the first or second clock signal, and a drain connected to the signal output terminal; and
a capacitor connected between the pull-up node (PU) and the signal output terminal.

6. The shift register of claim 5, wherein the pull-down driving module comprises:
a fifth transistor having a source and gate together connected to the second supply voltage (VDD), and a drain connected to a pull-down node (PD); and
a sixth transistor having a gate connected to the pull-up node (PU), a source connected to the pull-down node (PD), and a drain connected to the first supply voltage (VSS).

7. The shift register of claim 6, wherein the first pull-down module comprises:
a second transistor having a source connected to the pull-up node (PU), a gate connected to the pull-down node (PD) and a drain connected to the first supply voltage (VSS); and
a fourth transistor having a gate connected to the pull-down node (PD), a source connected to the signal output terminal, and a drain connected to the first supply voltage (VSS).

8. The shift register of claim 7, wherein the second pull-down module comprises:
a seventh transistor having a gate connected to an input node of the second pull-down module, a source connected to the pull-up node (PU), and a drain connected to the first supply voltage VSS;
an eighth transistor having a source connected to the second supply voltage (VDD), a gate connected to the input node of the second pull-down module, and a drain connected to the pull-down node (PD); and
a ninth transistor having a gate connected to the input node of the second pull-down module, a source connected to the signal output terminal, and a drain connected to the first supply voltage (VSS).

9. The shift register of claim 8, further comprising:
a sixteenth transistor having a drain connected to the pull-up node (PU), and a source and a gate together connected to the drain of the twelfth transistor.

10. The shift register of claim 1, wherein the forward scanning switch module comprises:
a tenth transistor having a drain connected to the pull-up node (PU), a gate connected to the forward scanning signal input terminal, and a source connected to a first output node of the pull-up driving module; and
an eleventh transistor having a source connected to the second signal input terminal, a gate connected to the forward scanning signal input terminal, and a drain connected to an input node of the second pull-down module.

11. The shift register of claim 10, wherein the reverse scanning switch module comprises:
a twelfth transistor having a drain connected to the pull-up node (PU), a gate connected to the reverse scanning signal input terminal, and a source connected to a second output node of the pull-up driving module; and a thirteenth transistor having a source connected to the first signal input terminal, a gate connected to the reverse scanning signal input terminal, and a drain connected to the input node of the second pull-down module.

12. The shift register of claim 11, wherein the pull-up driving module comprises:
a first transistor having a source and a gate together connected to the first signal input terminal, and a drain connected to the source of the tenth transistor; and
a fourteenth transistor having a source and a gate together connected to the second signal input terminal, and a drain connected to the source of the twelfth transistor.

13. The shift register of claim 12, wherein the pull-up module comprises:
a third transistor having a gate connected to the pull-up node (PU), a source receiving the first or second clock signal, and a drain connected to the signal output terminal; and
a capacitor connected between the pull-up node (PU) and the signal output terminal.

14. The shift register of claim 13, wherein the pull-down driving module comprises:
a fifth transistor having a source and gate together connected to the second supply voltage (VDD), and a drain connected to a pull-down node (PD); and
a sixth transistor having a gate connected to the pull-up node (PU), a source connected to the pull-down node (PD), and a drain connected to the first supply voltage (VSS).

15. The shift register of claim 14, wherein the first pull-down module comprises:
a second transistor having a source connected to the pull-up node (PU), a gate connected to the pull-down node (PD) and a drain connected to the first supply voltage (VSS); and
a fourth transistor having a gate connected to the pull-down node (PD), a source connected to the signal output terminal, and a drain connected to the first supply voltage (VSS).

16. The shift register of claim 15, wherein the second pull-down module comprises:
a seventh transistor having a gate connected to an input node of the second pull-down module, a source connected to the pull-up node (PU), and a drain connected to the first supply voltage (VSS);
an eighth transistor having a source connected to the second supply voltage (VDD), a gate connected to the input node of the second pull-down module, and a drain connected to the pull-down node (PD); and
a ninth transistor having a gate connected to the input node of the second pull-down module, a source connected to the signal output terminal, and a drain connected to the first supply voltage (VSS).

17. The shift register of claim 16, further comprising:
a fifteenth transistor having a gate connected to the input node of the second pull-down module, a drain connected to the first supply voltage (VSS), and a source connected to the pull-up node (PU).

18. A gate driving circuit comprising the shift register of claim 1.

19. A display apparatus comprising the gate driving circuit of claim 18.

* * * * *